(12) United States Patent
Namuduri et al.

(10) Patent No.: US 11,349,470 B2
(45) Date of Patent: May 31, 2022

(54) GATE DRIVER AND PROTECTION SYSTEM FOR A SOLID-STATE SWITCH

(71) Applicant: GM GLOBAL TECHNOLOGY OPERATIONS LLC, Detroit, MI (US)

(72) Inventors: Chandra S. Namuduri, Troy, MI (US); Rashmi Prasad, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 439 days.

(21) Appl. No.: 16/677,065

(22) Filed: Nov. 7, 2019

(65) Prior Publication Data

US 2021/0143811 A1    May 13, 2021

(51) Int. Cl.
*H03K 17/0812*    (2006.01)
(52) U.S. Cl.
CPC ............... *H03K 17/08122* (2013.01)
(58) Field of Classification Search
CPC ......... H03K 17/08122; H03K 17/0822; H03K 2217/0027
USPC ........................................................... 361/79
See application file for complete search history.

(56) References Cited

U.S. PATENT DOCUMENTS

| 4,070,701 | A  | * | 1/1978 | Hamden, Jr. | ........ H02M 3/3378 363/80 |
| 2009/0174353 | A1 | * | 7/2009 | Nakamura | ............ H02M 3/337 318/400.27 |
| 2017/0093390 | A1 | * | 3/2017 | Tsurumaru | ....... H03K 17/08128 |
| 2019/0103863 | A1 | * | 4/2019 | Inada | ...................... H02M 1/32 |
| 2019/0187190 | A1 | * | 6/2019 | Akahane | ................ H02H 7/222 |

* cited by examiner

*Primary Examiner* — Kevin J Comber
(74) *Attorney, Agent, or Firm* — Vivacqua Crane PLLC

(57) ABSTRACT

A circuitry includes an electronic solid-state switch including a first power terminal and a second power terminal and a driver and switch protection system electrically connected to the electronic solid-state switch. The driver and switch protection system includes an isolated bias power circuit configured to output a direct current voltage of at least fifteen volts, a current buffer circuit electrically connected between the isolated bias power circuit and the electronic solid-state switch, and a snubber circuit electrically connected to the first power terminal and the second power terminal.

16 Claims, 3 Drawing Sheets

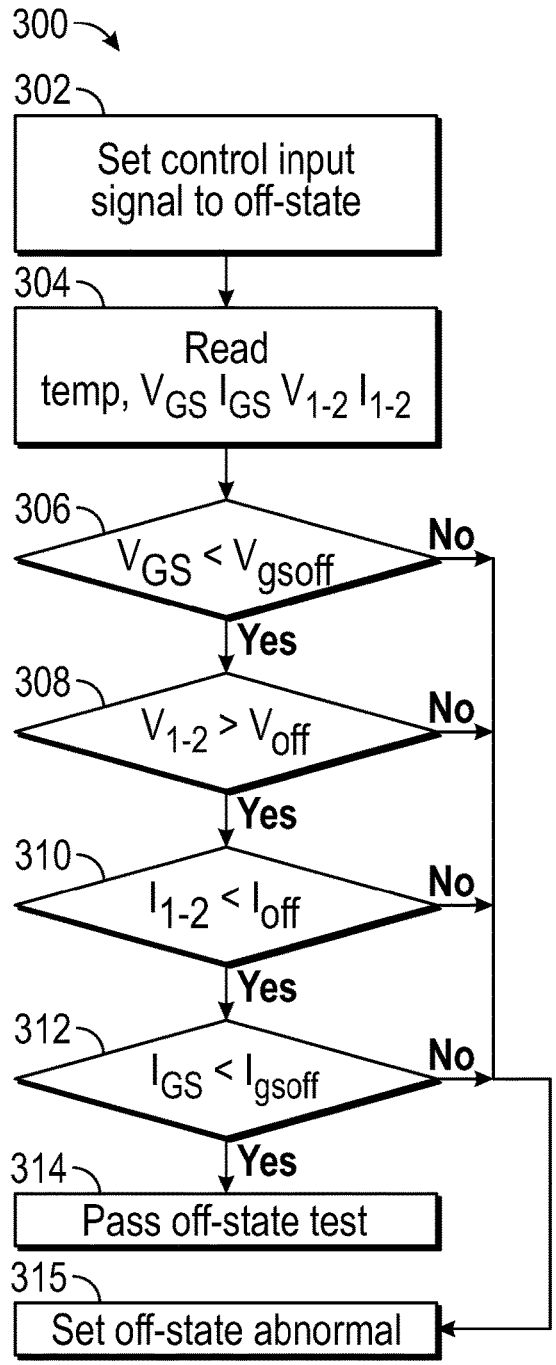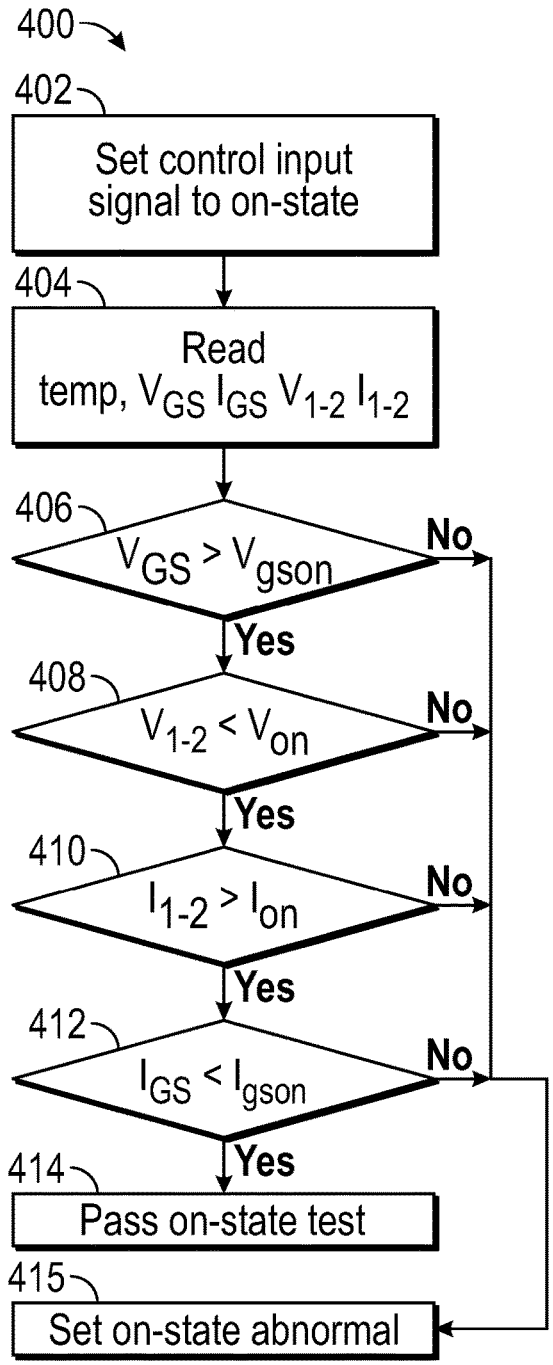
FIG. 2
FIG. 3

GATE DRIVER AND PROTECTION SYSTEM FOR A SOLID-STATE SWITCH

INTRODUCTION

The present disclosure relates to electrical components, and more specifically, to a gate driver and protection for an electronic solid-state switch.

Existing gate driver circuits are designed for inverter applications, consume high power, are bulky, and are not suited for integration for solid-state switches. Solid-state switches cannot absorb high energy during turn-off under shorted or overload conditions if the power source has significant inductance. Therefore, there is a need to develop a low power consumption and compact gate driver and protection circuit for a solid-state switch.

SUMMARY

The present disclosure relates gate driver and protection for an electronic solid-state switch. In an aspect of the present disclosure, a circuitry includes an electronic solid-state switch including a first power terminal and a second power terminal and a driver and switch protection system electrically connected to the electronic solid-state switch. The driver and switch protection system includes an isolated bias power circuit configured to output a dc voltage of at least fifteen volts, a current buffer circuit electrically connected between the isolated bias power circuit and the electronic solid-state switch, and a snubber circuit electrically connected across the first power terminal and the second power terminal.

The current buffer circuit may be configured to source and sink at least one ampere output current. The current buffer circuit may have an output resistance that is less than two Ohms.

The isolated bias power circuit may be configured as a printed circuit board. The isolated bias power circuit may be configured as an on-chip integrated transformer-based power supply with around one-watt output power +/−0.5 watt. The on-chip integrated transformer-based power supply includes a plurality of transformers windings.

The circuitry may further include a signal processing and diagnostic controller and an external controller each electrically connected to the electronic solid-state switch. The signal processing and diagnostic controller may include a plurality of comparators, and the external controller is configured to command the electronic solid-state switch to transition between an off-state and an on-state.

The external controller may be configured to command the electronic solid-state switch to transition to the off-state. In response to transitioning to the off-state, the signal processing and diagnostic controller is configured to read a gate-source voltage, a gate-source amperage, a temperature, an amperage of a current flowing between the first power terminal and the second power terminal, and a voltage between the first power terminal and the second power terminal of the electronic solid-state switch. The signal processing and diagnostic controller may be configured to compare the gate-source voltage with a predetermined-off gate-source voltage threshold.

The signal processing and diagnostic controller may be configured to determine that the gate-source voltage is less than the predetermined-off gate-source voltage threshold. In response to determining that the gate-source voltage is less than the predetermined-off gate-source voltage threshold, the signal processing and diagnostic controller may be configured to compare the voltage between the first power terminal and the second power terminal with a predetermined-off voltage threshold. The signal processing and diagnostic controller may be configured to determine that the voltage between the first power terminal and the second power terminal is greater than the predetermined-off voltage threshold. In response to determining that the voltage between the first power terminal and the second power terminal is greater than the predetermined-off voltage threshold, the signal processing and diagnostic controller may be configured to compare the amperage of the current between the first power terminal and the second power terminal with a predetermined-off amperage threshold.

The signal processing and diagnostic controller may be configured to determine that the amperage of the current between the first power terminal and the second power terminal is less than the predetermined-off amperage threshold. In response to determining that the amperage of the current between the first power terminal and the second power terminal is less than the predetermined-off amperage threshold. The signal processing and diagnostic controller may be configured to compare the gate-source amperage with a predetermined-off gate-source amperage threshold. The signal processing and diagnostic controller may be configured to determine that the gate-source amperage is less than the predetermined-off gate-source amperage threshold. In response to determining that the gate-source amperage is less than the predetermined-off gate-source amperage threshold. The signal processing and diagnostic controller may be configured to set a fault output signal to pass an off-state test, indicating that electronic solid-state switch is operating normally in the off-state.

The external controller is configured to command the electronic solid-state switch to transition to the on-state. In response to transitioning to the on-state, the signal processing and diagnostic controller may be configured to read a gate-source voltage, a gate-source amperage, a temperature, an amperage of the current flowing between the first power terminal and the second power terminal, and a voltage between the first power terminal and the second power terminal of the electronic solid-state switch. The signal processing and diagnostic controller may be configured to compare the gate-source voltage with a predetermined-on gate-source voltage threshold. The signal processing and diagnostic controller may be configured to determine that the gate-source voltage is greater than the predetermined-on gate-source voltage threshold. In response to determining that the gate-source voltage is greater than the predetermined-on gate-source voltage threshold.

The signal processing and diagnostic controller may be configured to compare the voltage between the first power terminal and the second power terminal with a predetermined-on voltage threshold. The signal processing and diagnostic controller may be configured to determine that the voltage between the first power terminal and the second power terminal is less than the predetermined-on voltage threshold. In response to determining that the voltage between the first power terminal and the second power terminal is less than the predetermined-on voltage threshold.

The signal processing and diagnostic controller may be configured to compare the amperage of the current between the first power terminal and the second power terminal with a predetermined-on amperage threshold. The signal processing and diagnostic controller may be configured to determine that the amperage of the current between the first power terminal and the second power terminal is greater than the predetermined-on amperage threshold. In response to determining that the amperage of the current between the first power terminal and the second power terminal is greater than the predetermined-on amperage threshold the signal processing and diagnostic controller may be configured to compare the gate-source amperage with a predetermined-on gate-source amperage threshold. The signal processing and diagnostic controller may be configured to determine that the gate-source amperage is less than the predetermined-on gate-source amperage threshold. In response to determining that the gate-source amperage is less than the predetermined-on gate-source amperage threshold, the signal processing and diagnostic controller may be configured to set a fault output signal to pass an on-state test, indicating that electronic solid-state switch is operating normally in the on-state.

The external controller is configured to command the electronic solid-state switch to transition to the off-state. In response to transitioning to the off-state, the signal processing and diagnostic controller may be configured to read a gate-source voltage, a gate-source amperage, a temperature, an amperage of the current flowing between the first power terminal and the second power terminal, and a voltage between the first power terminal and the second power terminal of the electronic solid-state switch. The signal processing and diagnostic controller may be configured to compare the amperage of the current flowing between the first power terminal and the second power terminal with a first predetermined-degradation-current threshold. The signal processing and diagnostic controller may be configured to determine that the amperage of the current flowing between the first power terminal and the second power terminal is greater than the first predetermined-degradation-current threshold.

In response to determining that the amperage of the current flowing between the first power terminal and the second power terminal is greater than the first predetermined-degradation-current threshold, the signal processing and diagnostic controller may be configured to compare the amperage of the current flowing between the first power terminal and the second power terminal with a second predetermined-degradation-current threshold. The signal processing and diagnostic controller may be configured to determine that the amperage of the current flowing between the first power terminal and the second power terminal is greater than the second predetermined-degradation-current threshold, wherein the second predetermined-degradation-current threshold is greater than the first predetermined-degradation-current threshold. In response to determining that the amperage of the current flowing between the first power terminal and the second power terminal is greater than the second predetermined-degradation-current threshold, the signal processing and diagnostic controller may be configured to send a fault output signal, setting a degradational level of the electronic solid-state switch to degradation level two.

The external controller is configured to command the electronic solid-state switch to transition to the on-state. In response to transition to the on-state, the signal processing and diagnostic controller may be configured to read a gate-source voltage, a gate-source amperage, a temperature, an amperage of the current flowing between the first power terminal and the second power terminal, and a voltage between the first power terminal and the second power terminal of the electronic solid-state switch. The signal processing and diagnostic controller may be configured to calculate a drain-source resistance of the electronic solid-state switch by dividing the voltage between the first power terminal and the second power terminal by the amperage of the current flowing between the first power terminal and the second power terminal.

In response to calculating the drain-source resistance of the electronic solid-state switch, the signal processing and diagnostic controller may be configured to compare the drain-source resistance and a predetermined on-resistance threshold. The signal processing and diagnostic controller may be configured to determine that the drain-source resistance is greater than the predetermined on-resistance threshold.

In response to determining that the drain-source resistance is greater than the predetermined on-resistance threshold. The signal processing and diagnostic controller may be configured to compare the gate-source amperage with a predetermined gate-source amperage threshold. The signal processing and diagnostic controller may be configured to determine that the gate-source amperage is greater than the predetermined gate-source amperage threshold. In response to determining that the gate-source amperage is greater than the predetermined gate-source amperage threshold, the signal processing and diagnostic controller may be configured to send a fault output signal, setting the degradational level of the electronic solid-state switch to degradation level four.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

FIG. 2 is a flowchart of a first diagnostic method.
FIG. 3 is a flowchart of a second diagnostic method.

DETAILED DESCRIPTION

The following detailed description is merely exemplary in nature and is not intended to limit the application and uses. Furthermore, there is no intention to be bound by expressed or implied theory presented in the preceding introduction, summary or the following detailed description.

Embodiments of the present disclosure may be described herein in terms of functional and/or logical block components and various processing steps. It should be appreciated that such block components may be realized by a number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that alternative or additional functional relationships or physical connections may be present in an embodiment of the present disclosure.

Figure 1:
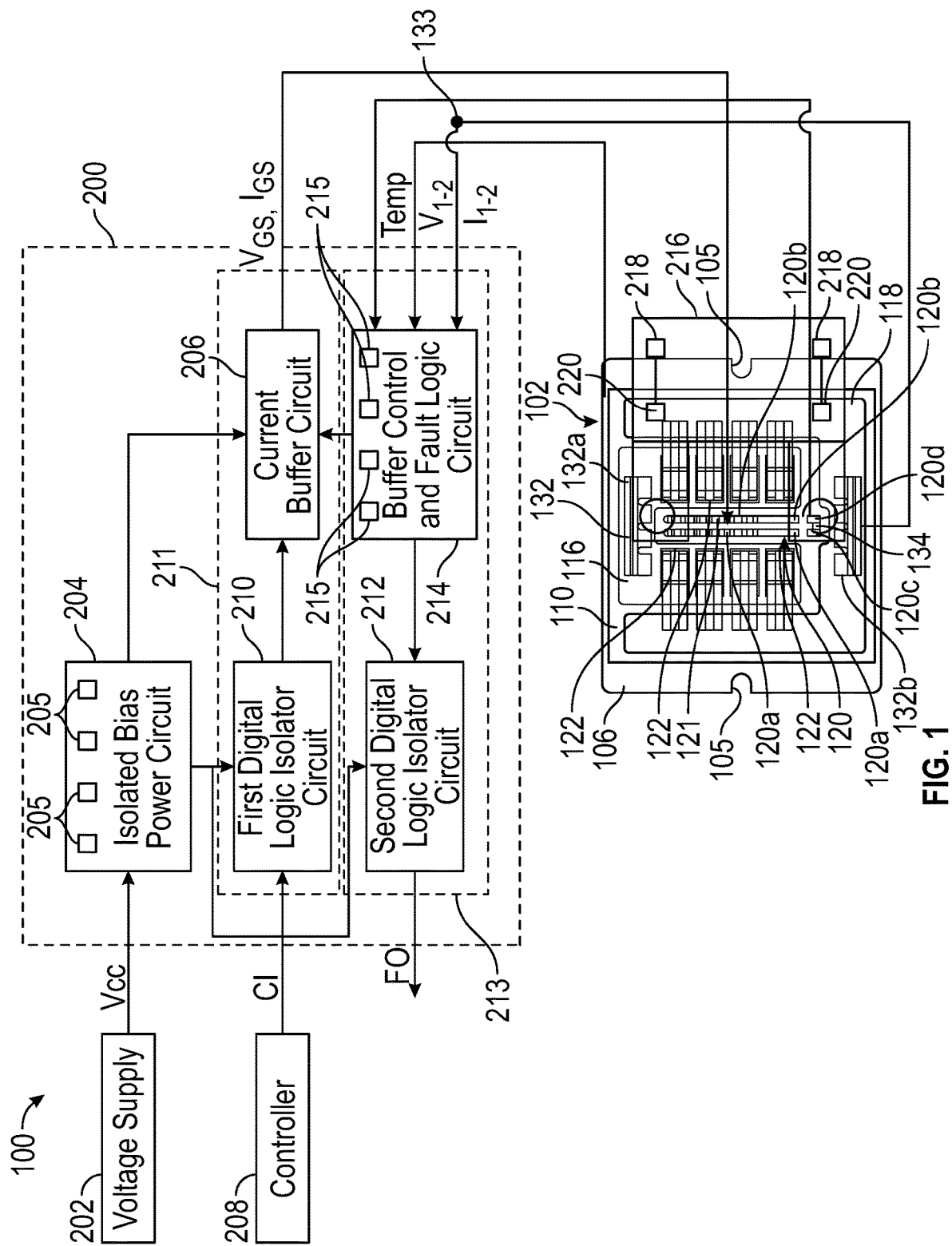
FIG. 1 is a schematic diagram of a circuitry including an electronic solid-state switch and a gate driver and protection system electrically connected to the electronic solid-state switch.

FIG. 1 illustrates a circuitry 100 including an electronic solid-state switch 102 and a gate driver and protection system 200. The electronic solid-state switch 102 has an off-state and an on-state. The electronic solid-state switch 102 is able to withstand at least 650 volts (and more preferably at least 1200 volts) during the off-state and carry at least 400 amperes of continuous current during the on-state. Due to the configuration described below, the gate driver and protection system 200 consumes less than one watt and is compact for close integration in close proximity to the terminals of the electronic solid-state switch 102. The dimensions of the gate driver and protection system 200 do not exceed 55 millimeters of length, 25 millimeters of width, and 10 millimeters of height.

The electronic solid-state switch 102 includes a base plate 106 having mounting holes 105 on opposite sides of the base plate 106. The base plate 106 has a planar shape (and therefore a flat configuration) to minimize the overall size of the electronic solid-state switch 102. In addition, the base plate 106 may be wholly or partly made of an thermally conductive material, such as a metal, metal alloy or metal matrix composite. For example, the base plate 106 may be wholly or partly made of copper, aluminum, Aluminum-Silicon-Carbide (AlSiC), copper infused graphite, graphene, copper foam, etcetera and may be mounted to a heat sink.

The electronic solid-state switch 102 includes an electrically insulating and thermally conductive layer 110 disposed on (although not directly on) the base plate 106. The electrically insulating and thermally conductive layer 110 may be wholly or partly made of a ceramic material. Suitable ceramic materials for the electrically insulating and thermally conductive layer 110 include, but are not limited, to aluminum oxide ($Al_2O_3$), Aluminum Nitride (AlN), Aluminum Silicon Carbide (AlSiC), Silicone Nitride ($Si_3N_4$), among others. The electronic solid-state switch 102 includes a solder layer disposed between the base plate 106 and the electrically insulating and thermally conductive layer 110 to connect the base plate 106 to the electrically insulating and thermally conductive layer 110. The term "solder" means a low-melting alloy, especially one based on lead and tin or (for higher temperatures) on brass or silver, used for joining less fusible metals. The electronic solid-state switch 102 further includes a metallic sheet directly coupled to the electrically insulating and thermally conductive layer 110 to form a direct bonded substrate. The metallic sheet may be wholly or partly made of an aluminum to form a direct bonded aluminum (DBA) substrate in conjunction of the electrically insulating and thermally conductive layer 110. The metallic sheet may be directly coupled (and directly disposed on) to the solder layer to enhance the structural integrity of the electronic solid-state switch 102.

The electronic solid-state switch 102 further includes a first electrically conductive trace 116 directly disposed on the electrically insulating and thermally conductive layer 110 to minimize the size occupied by the electronic solid-state switch 102. The first electrically conductive trace 116 is directly disposed on (and directly bonded to) the electrically insulating and thermally conductive layer 110 to enhance the structural integrity of the electronic solid-state switch 102. The first electrically conductive trace 116 has a planar shape to minimize its size and forms a positive terminal. Further, the first electrically conductive trace 116 is wholly or partly made of a metallic material, such as copper.

The electronic solid-state switch 102 further includes a second electrically conductive trace 118 directly disposed on the electrically insulating and thermally conductive layer 110 to minimize the space occupied by the electronic solid-state switch 102. For instance, the second electrically conductive trace 118 is directly disposed on (and directly bonded to) the electrically insulating and thermally conductive layer 110. The second electrically conductive trace 118 has a planar shape to minimize its size and forms a negative terminal. Further, the second electrically conductive trace 118 is made of a metallic material, such as copper or aluminum.

The electronic solid-state switch 102 further includes a plurality of signal conductors 120 (e.g., a first signal conductor 120a and a second signal conductor 120b) directly disposed on the electrically insulating and thermally conductive layer 110. The first electrically conductive trace 116 is substantially U-shaped and partially surrounds the signal conductors 120. In the present disclosure, the term "substantially U-shaped" means a shape including two parallel legs directly connected to another leg that is perpendicular to the two parallel legs. The second electrically conductive trace 118 is also substantially U-shaped and partially surrounds first electrically conductive trace 116. The substantially U-shape of the first electrically conductive trace 116 and the second electrically conductive trace 118 helps minimize the size of the electronic solid-state switch 102. The first signal conductor 120a and the second signal conductor 120b are wholly or partly made of a metallic material, such as copper or aluminum, and are directly bonded to the electrically insulating and thermally conductive layer 110 (e.g., ceramic layer). The first signal conductor 120a may be refer to as the source conductor (S), and the second signal conductor 120b may be referred to as the gate conductor. The control inputs carried through the signal conductors 120 draw near zero power (i.e., less than one watts) keep to the electronic solid-state switch 102 ON or OFF.

The electronic solid-state switch 102 includes a plurality of semiconductor dies 122 each disposed directly on the first electrically conductive trace 116 to facilitate the flow of electricity. Although the depicted embodiment shows eight semiconductor dies 122, the electronic solid-state switch 102 includes between four and sixteen semiconductor dies 122 (each with a voltage rating from 650 volts to 1200 volts) to electrically connected to one another in parallel to carry at least 400 A current and enhance scalability. Each of the plurality of semiconductor dies 122 forms a metal-oxide-semiconductor filed-effect transistor (MOSFET) and includes a source terminal, a gate terminal, and a drain terminal. Each of the semiconductor dies 122 has a minimum area of twenty square millimeters to carry a total of at least 400 A current.

Each of the plurality of semiconductor dies 122 includes a semiconductor material, such as silicon, silicon carbide, gallium oxide, and gallium nitride. The semiconductor dies 122 are arranged in a predetermined pattern on top of the direct bonded substrate to maintain substantially equal current and temperature distribution. The die spacing and terminal location is selected to maintain substantially equal current and temperature distribution between the semiconductor dies 122 (which are electrically connected in) and the minimize package size. The bottom side of each of the semiconductor dies 122 directly coupled to the first electrically conductive trace 116. The placement of the semiconductor dies 122 and the pattern of the direct bonded substrate achieve equal current distribution and low parasitic inductance. The electronic solid-state switch 102 includes a plurality of damping resistors 121 each electrically connected to the gate terminal of a respective MOSFET in series to prevent or at least minimize power oscillations. The plurality of semiconductor dies 122 are electrically connected in parallel to achieve scalable current rating (e.g., multiple of 100 A).

The electronic solid-state switch 102 includes a first plurality of electrical bonds each electrically connected to a respective one of the plurality of semiconductor dies 122. Specifically, each of the first plurality of electrical bonds electrically connects the source terminal of a respective MOSFET to the second electrically conductive trace 118. Each of the first plurality of electrical bonds electrically interconnects the plurality of semiconductor dies 122 and the second electrically conductive trace 118. Each of the first plurality of electrical bonds may be a high current wire bond, ribbon bond or a foil bond to minimize parasitic inductance and resistance.

The electronic solid-state switch 102 further includes a second plurality of electrical bonds each electrically connecting the plurality of signal conductors 120 to the plurality of semiconductor dies 122. Specifically, each of the second plurality of electrical bonds electrically connects the gate terminal and a source terminal of a respective MOSFET to a first signal conductor 120a and a second signal conductor 120b, respectively. The second plurality of electrical bonds may be low current wire bonds to minimize parasitic inductance and resistance.

The electronic solid-state switch 102 may include a plurality of power terminal 132 (e.g., a first power terminal 132a and a second power terminal 132b). The first power terminal 132a is directly coupled to (and electrically connected to) the first electrically conductive trace 116. The second power terminal 132b is directly coupled to (and electrically connected to) the second electrically conductive trace 118. The power terminals 132 are electrically isolated from the base plate 106. The electronic solid-state switch 102 may optionally include one or more current sensor electrically or magnetically connected to the second power terminal 132b to measure the current (e.g., in amperes) of the electronic solid-state switch 102.

The electronic solid-state switch 102 may optionally include one or more thermistors 134 disposed on electrically insulating and thermally conductive layer 110 to measure (with optimal accuracy) the temperature of the electronic solid-state switch 102. The thermistors 134 may be directly coupled to the signal conductors 120 to measure and monitor the temperature of the electronic solid-state switch 102. One terminal of the thermistor 134 may be directly coupled to a first signal conductor 120a, and another terminal of the thermistor 134 is directly coupled to the second signal conductor 120d. Alternatively, the thermistors 134 may be embedded as a chip close to the bare semiconductor die 122. The thermistors 134 help detect and prevent thermal overload.

The circuitry 100 further includes a gate driver and protection system 200 to protect the electronic solid-state switch 102. The circuitry 100 further includes voltage supply 202 configured to output a supply voltage Vcc. The gate driver and protection system 200 further includes an isolated bias power circuit 204 electrically connected to the voltage supply 202. As such, the isolated bias power circuit 204 is configured to receive the supply voltage Vcc from the voltage supply 202. The isolated bias power circuit 204 is configured to output a fixed direct current of at least fifteen volts. The isolated bias power supply circuit 204 is configured as a printed circuit board to minimize a size of the gate driver and switch protection system 200. Alternatively, the isolated bias power supply circuit 204 may be configured as an on-chip integrated transformer-based power supply to minimize the size of the circuitry 10. As such, the isolated bias power supply circuit 204 may include one or more transformers 205 to provide a bias voltage of at least 15 volts of direct current. Thus, the isolated bias power supply circuit 204 may convert and isolate the supply voltage Vcc supplied by the voltage supply 202 and output a bias voltage of at least 15 volts of direct current through the transformers 205. The isolated bias power supply circuit 204 has a minimum of 1500 volts input to output isolation voltage withstand rating, and a minimum of 9 millimeters creepage.

The gate driver and protection system 200 further includes a current buffer circuit 206 electrically connected to the isolated bias power circuit 204. Specifically, current buffer circuit 206 is electrically connected between a gate terminal of the electronic solid-state switch 102 and the isolated bias power circuit 204. The current buffer circuit 206 is configured to source and sink at least 1 amperes of output current and has an output resistance of less than 2 Ohms. It is envisioned that the current buffer circuit 206 is configured to source and sink at least 1 amperes of output current and has an output resistance of less than 2 Ohms. The current buffer circuit 206 is configured to turn the electronic solid-state switch 102 between an on-state and an off-state in less than five microseconds under non-inductive load operation. For example, the current buffer circuit 206 is configured to turn the electronic solid-state switch 102 between an on-state and an off-state in less than two microseconds under non-inductive load operation. The current supplied by the isolated bias power circuit 204 to the electronic solid-state switch 102 through the current buffer circuit 206 has a gate-source voltage $V_{GS}$ and a gate-source amperage $I_{GS}$. The gate-source voltage $V_{GS}$ is the control voltage supplied to the electronic solid-state switch 102. The gate-source amperage $I_{GS}$ is the amperage of the control current supplied to the electronic solid-state switch 102.

The circuitry 100 further includes an external controller 208 configured to provide control inputs. The external controller 208 includes at least one processor and a computer non-transitory readable storage device or media. The processor can be a custom made or commercially available processor, a central processing unit (CPU), a graphics processing unit (GPU), an auxiliary processor among several processors associated with the external controller 208, a semiconductor-based microprocessor (in the form of a microchip or chip set), a macroprocessor, a combination thereof, or generally a device for executing instructions. The computer readable storage device or media may include volatile and nonvolatile storage in read-only memory (ROM), random-access memory (RAM), and keep-alive memory (KAM), for example. KAM is a persistent or non-volatile memory that may be used to store various operating variables while the processor is powered down. The computer-readable storage device or media may be implemented using a number of memory devices such as PROMs (programmable read-only memory), EPROMs (electrically PROM), EEPROMs (electrically erasable PROM), flash memory, or another electric, magnetic, optical, or combination memory devices capable of storing data, some of which represent executable instructions, used by the external controller 208 in controlling the gate driver and protection system 200.

The gate driver and protection system 200 further includes a first digital-logic-isolator circuit 210 and a second digital-logic-isolator circuit 212 each electrically connected to the isolated bias power circuit 204. Accordingly, each of the first digital-logic-isolator circuit 210 and the second digital-logic-isolator circuit 212 receives bias voltage from the isolated bias power circuit 204. Each of the first digital-logic-isolator circuit 210 and the second digital-logic-isolator circuit 212 as a chip scale package to minimize of the gate driver and protection system 200. The first digital-logic-isolator circuit 210 is electronically coupled to the external controller 208 and is therefore configured to isolate and control input receive from the external controller 208. The second digital-logic-isolator circuit 212 is configured to control the fault output signal FO. The first digital-logic-isolator circuit 210 and the current buffer circuit 206 collectively form a gate driver 211. In the present disclosure, the term "gate driver" means a power amplifier that accepts a lower-power input from a controller (e.g., external controller 208) and produced a high-current drive input for the gate of a high-power transistor (e.g., electronic solid-state switch 102). The time rate of change of the current (di/dt) and time rate of change of the voltage (dv/dt) are controlled to minimize the transient voltage and current overshoots to be less than 10% of the operating voltage and current.

The gate driver and protection system 200 further includes a buffer-control and fault logic circuit 214 electrically connected to the electronic solid-state switch 102. As such, the buffer-control and fault logic circuit 214 receives signals from the thermistors 134 (which indicate the temperature of the electronic solid-state switch 102) and the voltage $V_{1-2}$ between the first power terminal 132a and the second power terminal 132b. A current sensor 133 may be electronically coupled to the electronic solid-state switch 102. The current sensor 133 is configured to measure the amperage $I_{1-2}$ of the current flowing between the first power terminal 132a and the second power terminal 132b. The current sensor 133 may be a fast-current sensor and/or a switch on-voltage sensor to limit the short circuit or overload current to less than 120% of the rated current with delay of less than 2 microseconds. The current sensor 133 allows detection of overcurrent and safe turn-off of the electronic solid-state switch 102. The buffer-control and fault logic circuit 214 electrically connected to the current sensor 133. As such, the buffer-control and fault logic circuit 214 is configured to receive signals from the current sensor 133 that indicate the amperage $I_{1-2}$ of the current flowing between the first power terminal 132a and the second power terminal 132b. The buffer-control and fault logic circuit 214 and the second digital-logic isolator circuit 212 collectively form a signal processing and diagnostic controller 213. The signal processing and diagnostic controller 213 may include a plurality of comparator 215, such as an op-amp voltage comparator, for comparing two voltages or current. In the present disclosure, the term "comparator" means a circuit that compares two voltages or currents and outputs a signal indicating which is larger. The buffer-control and fault logic circuit 214 may include the comparators 215 (i.e., current comparators and/or voltage comparators) to compare two voltages or currents and outputs a signal indicating which is larger.

The gate driver and protection system 200 further includes a snubber circuit 216 electrically connected in close proximity to the first power terminal 132a and the second power terminal 132b of the electronic solid-state switch 102 to allow switching of the rated current from a voltage supply (which has a predetermined inductance) connected in series with the switch in less than 0.5 milliseconds (e.g., less than 0.2 milliseconds) while minimizing transient voltage across the electronic solid-state switch 102. The snubber circuit 216 may include one or more transient voltage suppressors (TVS) 218, such as Zener diode, electrically connected (in parallel for example) to a damping resistor-capacitor circuit (RC circuit) 220 of predetermined thresholds. The TVS 218 has a breakdown voltage of at least 125% of the maximum operating input voltage, but less than about 90% of the rated voltage of the electronic solid-state switch 102. The energy rating of the TVS 218 is greater than $0.5 L_s I_{pk}^2$, where $L_s$ is total inductance (i.e., the inductance of the voltage supply and the load) and $I_{pk}$ is the worst-case current to be interrupted by the electronic solid-state switch 102. Alternatively, the snubber circuit 216 includes a series RC circuit 220 electrically connected across the first power terminal 132a and the second power terminal 132b of the electronic solid-state switch 102. The resistance of the resistor and the capacitance of the RC circuit 220 are predetermined to limit the voltage across the electronic solid-state switch 102 to less than about 90% of the rated voltage and achieve load current interruption in less than a predetermined amount of time under a predetermined total source and load inductance.

FIG. 2 is a flowchart of a first diagnostic method 300. The first diagnostic method 300 begins at block 302, in which the external controller 208 sets the control input signal CI to off-state. In other words, the external controller 208 commands the electronic solid-state switch 102 to transition to the off-state. Then, the first diagnostic method 300 proceeds to block 304.

At block 304, the signal processing and diagnostic controller 213 reads the gate-source voltage $V_{GS}$, the gate-source amperage $I_{GS}$, the temperature T, the amperage $I_{1-2}$ of the current flowing between the first power terminal 132a and the second power terminal 132b, and the voltage $V_{1-2}$ between the first power terminal 132a and the second power terminal 132b. The $V_{GS}$ is the control voltage of supplied to the electronic solid-state switch 102 between the gate-source terminals. The amperage $I_{GS}$ is amperage of the current supplied to the electronic solid-state switch 102 through the gate-source terminals. The temperature T is the temperature of the electronic solid-state switch 102. Then, the first diagnostic method 300 continues to block 306.

At block 306, the signal processing and diagnostic controller 213 compares the gate-source voltage $V_{GS}$ with a predetermined-off gate-source voltage threshold $V_{gsoff}$. The predetermined-off gate-source voltage threshold $V_{gsoff}$ is the maximum set-voltage that can be supplied to the electronic solid-state switch 102 that can hold the electronic solid-state switch 102 in the off-state. If the gate-source voltage $V_{GS}$ is not less than the predetermined-off gate-source voltage threshold $V_{gsoff}$, then the first diagnostic method 300 proceeds to block 315. At block 315, the signal processing and diagnostic controller 213 outputs the fault output signal FO. At block 315, the signal processing and diagnostic controller 213 sets the fault output signal FO to off-state abnormal, indicating that the electronic solid-state switch 102 is operating abnormally in the off-state. If the gate-source voltage $V_{GS}$ is less than the predetermined-off gate-source voltage threshold $V_{gsoff}$, then the first diagnostic method 300 proceeds to block 308.

At block 308, the signal processing and diagnostic controller 213 compares the voltage $V_{1-2}$ between the first power terminal 132a and the second power terminal 132b with a predetermined-off voltage threshold $V_{off}$. The predetermined-off voltage threshold $V_{off}$ is the minimum set-voltage that should be outputted from the electronic solid-state switch 102 upon transition to the off-state. If the voltage $V_{1-2}$ is not greater than the predetermined-off voltage threshold $V_{off}$, then the first diagnostic method 300 proceeds to block 315. At block 315, the signal processing and diagnostic controller 213 outputs the fault output signal FO. At block 315, the signal processing and diagnostic controller 213 sets the fault output signal FO to off-state abnormal, indicating that the electronic solid-state switch 102 is operating abnormally in the off-state. If the voltage $V_{1-2}$ is greater than the predetermined-off voltage threshold $V_{off}$, then the first diagnostic method 300 proceeds to block 310.

At block 310, the signal processing and diagnostic controller 213 compares the amperage $I_{1-2}$ of the current between the first power terminal 132a and the second power terminal 132b with a predetermined-off amperage threshold $I_{off}$. The predetermined-off amperage threshold $I_{off}$ is the maximum set-amperage that could be outputted from the electronic solid-state switch 102 upon transition to the off-state. If the amperage $I_{1-2}$ is not less than predetermined-off amperage threshold $I_{off}$, then the first diagnostic method 300 proceeds to block 315. At block 315, the signal processing and diagnostic controller 213 outputs the fault output signal FO. At block 315, the signal processing and diagnostic controller 213 sets the fault output signal FO to off-state abnormal, indicating that the electronic solid-state switch 102 is operating abnormally in the off-state. If the amperage $I_{1-2}$ is less than predetermined-off amperage threshold $I_{off}$, then the first diagnostic method 300 proceeds to block 312.

At block 312, the signal processing and diagnostic controller 213 compares the gate-source amperage $I_{GS}$ with a predetermined-off gate-source amperage threshold $I_{gsoff}$. The predetermined-off gate-source amperage threshold $I_{gsoff}$ is the maximum set-current that could be supplied to the electronic solid-state switch 102 to transition the electronic solid-state switch 102 to the off-state. If the gate-source amperage $I_{GS}$ is not less than the predetermined-off gate-source amperage threshold $I_{gsoff}$, then the first diagnostic method 300 proceeds to block 315. At block 315, the signal processing and diagnostic controller 213 outputs the fault output signal FO. At block 315, the signal processing and diagnostic controller 213 sets the fault output signal FO to off-state abnormal, indicating that the electronic solid-state switch 102 is operating abnormally in the off-state. If the gate-source amperage $I_{GS}$ is less than the predetermined-off gate-source amperage threshold $I_{gsoff}$, then the first diagnostic method 300 proceeds to block 314. At block 314, the signal processing and diagnostic controller 213 sets the fault output signal FO to pass the off-state test, indicating that electronic solid-state switch 102 is operating normally in the off-state.

FIG. 3 is a flowchart of a second diagnostic method 400, which may be combined with the first diagnostic method 300. The second diagnostic method 400 begins at block 402, in which the external controller 208 sets the control input signal CI to on-state. In other words, the external controller 208 commands the electronic solid-state switch 102 to transition to the on-state. Then, the second diagnostic method 400 proceeds to block 304.

At block 404, the signal processing and diagnostic controller 213 reads the gate-source voltage $V_{GS}$, the gate-source amperage $I_{GS}$, the temperature T, the amperage $I_{1-2}$ of the current flowing between the first power terminal 132a and the second power terminal 132b, and the voltage $V_{1-2}$ between the first power terminal 132a and the second power terminal 132b. The voltage $V_{GS}$ is the voltage supplied to the electronic solid-state switch 102 between the gate-source terminals. The amperage $I_{GS}$ is amperage of the current supplied to the electronic solid-state switch 102 through the gate-source terminals. The temperature T is the temperature of the electronic solid-state switch 102. Then, the second diagnostic method 400 continues to block 406.

At block 406, the signal processing and diagnostic controller 213 compares the gate-source voltage $V_{GS}$ with a predetermined-on gate-source voltage threshold $V_{gson}$. The predetermined-on gate-source voltage threshold $V_{gson}$ is the minimum set-voltage that should be supplied to the electronic solid-state switch 102 to transition the electronic solid-state switch 102 to the on-state. If the gate-source voltage $V_{GS}$ is not greater than the predetermined-on gate-source voltage threshold $V_{gson}$, then the second diagnostic method 400 proceeds to block 415. At block 415, the signal processing and diagnostic controller 213 outputs the fault output signal FO. At block 415, the signal processing and diagnostic controller 213 sets the fault output signal FO to on-state abnormal, indicating that the electronic solid-state switch 102 is operating abnormally in the on-state. If the gate-source voltage $V_{GS}$ is greater than the predetermined-on gate-source voltage threshold $V_{gson}$, then the second diagnostic method 400 proceeds to block 408.

At block 408, the signal processing and diagnostic controller 213 compares the voltage $V_{1-2}$ between the first power terminal 132a and the second power terminal 132b with a predetermined-on voltage threshold $V_{on}$. The predetermined-on voltage threshold $V_{on}$ is the maximum set-voltage that may be present across from the electronic solid-state switch 102 upon transition to the on-state. If the voltage $V_{1-2}$ is not less than the predetermined-on voltage threshold $V_{on}$, then the second diagnostic method 400 proceeds to block 415. At block 415, the signal processing and diagnostic controller 213 outputs the fault output signal FO. At block 415, the signal processing and diagnostic controller 213 sets the fault output signal FO to on-state abnormal, indicating that the electronic solid-state switch 102 is operating abnormally in the on-state. If the voltage $V_{1-2}$ is less than the predetermined-on voltage threshold $V_{on}$, then the second diagnostic method 400 proceeds to block 410.

At block 410, the signal processing and diagnostic controller 213 compares the amperage $I_{1-2}$ of the current between the first power terminal 132a and the second power terminal 132b with a predetermined-on amperage threshold $I_{on}$. The predetermined-on amperage threshold $I_{on}$ is the minimum set-amperage that should be outputted from the electronic solid-state switch 102 upon transition to the on-state. If the amperage $I_{1-2}$ is not greater than predetermined-on amperage threshold $I_{on}$, then the second diagnostic method 400 proceeds to block 415. At block 415, the signal processing and diagnostic controller 213 outputs the fault output signal FO. At block 415, the signal processing and diagnostic controller 213 sets the fault output signal FO to on-state abnormal, indicating that the electronic solid-state switch 102 is operating abnormally in the on-state. If the amperage $I_{1-2}$ is greater than predetermined-on amperage $I_{on}$, then the second diagnostic method 400 proceeds to block 412.

At block 412, the signal processing and diagnostic controller 213 compares the gate-source amperage $I_{GS}$ with a predetermined-on gate-source amperage threshold $I_{gson}$. The predetermined-off gate-source amperage threshold $I_{gson}$ is the maximum set-voltage that should be supplied to the electronic solid-state switch 102 to transition the electronic solid-state switch 102 to the on-state. If the gate-source amperage $I_{GS}$ is not less than the predetermined-on gate-source amperage threshold $I_{gson}$, then the second diagnostic method 400 proceeds to block 415. At block 415, the signal processing and diagnostic controller 213 outputs the fault output signal FO. At block 415, the signal processing and diagnostic controller 213 sets the fault output signal FO to on-state abnormal, indicating that the electronic solid-state switch 102 is operating abnormally in the on-state. If the gate-source amperage $I_{GS}$ is less than the predetermined-on gate-source amperage threshold $I_{gson}$, then the second diagnostic method 400 proceeds to block 414. At block 414, the signal processing and diagnostic controller 213 sets the fault output signal FO to pass the on-state test, indicating that electronic solid-state switch 102 is operating normally in the on-state.

Figure 4:
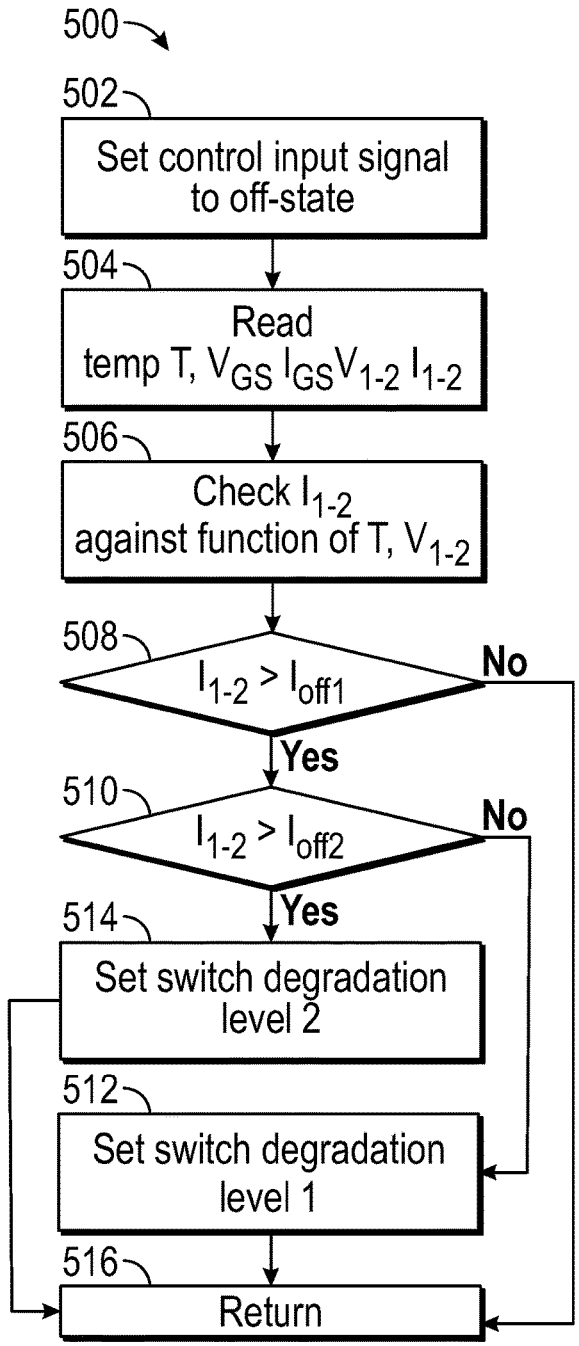
FIG. 4 is a flowchart of a third diagnostic method.

FIG. 4 is a flowchart of a third diagnostic method 500 to determine the degradation level of the electronic solid-state switch 102. The third diagnostic method 500 begins at block 502, in which the external controller 208 sets the control input signal CI to off-state. In other words, the external controller 208 commands the electronic solid-state switch 102 to transition to the off-state. Then, the third diagnostic method 500 proceeds to block 504.

At block 504, the signal processing and diagnostic controller 213 reads the gate-source voltage $V_{GS}$, the gate-source amperage $I_{GS}$, the temperature T, the amperage $I_{1-2}$ of the current flowing between the first power terminal 132a and the second power terminal 132b, and the voltage $V_{1-2}$ between the first power terminal 132a and the second power terminal 132b. The voltage $V_{GS}$ is the voltage supplied to the electronic solid-state switch 102 between the gate-source terminals. The amperage $I_{GS}$ is amperage of the current supplied to the electronic solid-state switch 102 through the gate-source terminals. The temperature T is the temperature of the electronic solid-state switch 102. Then, the third diagnostic method 500 continues to block 506.

At block 506, the signal processing and diagnostic controller 213 checks the amperage $I_{1-2}$ of the current flowing between the first power terminal 132a and the second power terminal 132b against the function of the temperature T of the electronic solid-state switch 102, and the voltage $V_{1-2}$ between the first power terminal 132a and the second power terminal 132b. This function may be in a look-up table developed through testing. After block 506, the third diagnostic method 500 continues to block 508.

At block 508, the signal processing and diagnostic controller 213 compares the amperage $I_{1-2}$ of the current flowing between the first power terminal 132a and the second power terminal 132b with a first predetermined-degradation-current threshold $I_{off1}$. If the amperage $I_{1-2}$ of the current flowing between the first power terminal 132a and the second power terminal 132b is not greater than the first predetermined-degradation-current threshold $I_{off1}$, then the third diagnostic method 500 proceeds to block 516. At block 516, the third diagnostic method 500 returns to the rest of the control steps. If the amperage $I_{1-2}$ of the current flowing between the first power terminal 132a and the second power terminal 132b is greater than the first predetermined-degradation-current threshold $I_{off1}$, then the third diagnostic method 500 proceeds to block 510.

At block 510, the signal processing and diagnostic controller 213 compares the amperage $I_{1-2}$ of the current flowing between the first power terminal 132a and the second power terminal 132b with a second predetermined-degradation-current threshold $I_{off2}$. The second predetermined-degradation-current threshold $I_{off2}$ is greater than the first predetermined-degradation-current threshold $I_{off1}$. If the amperage $I_{1-2}$ of the current flowing between the first power terminal 132a and the second power terminal 132b is not greater than the second predetermined-degradation-current threshold $I_{off2}$, then the third diagnostic method 500 proceeds to block 512. At block 512, the signal processing and diagnostic controller 213 sends the fault output signal FO, setting the degradational level of the electronic solid-state switch 102 to degradation level 1. After block 512, the third diagnostic method 500 proceeds to block 516. If the amperage $I_{1-2}$ of the current flowing between the first power terminal 132a and the second power terminal 132b is greater than the second predetermined-degradation-current threshold $I_{off2}$, then the third diagnostic method 500 proceeds to block 514. At block 514, the signal processing and diagnostic controller 213 sends the fault output signal FO, setting the degradational level of the electronic solid-state switch 102 to degradation level 2. After block 514, the third diagnostic method 500 proceeds block 516.

Figure 5:
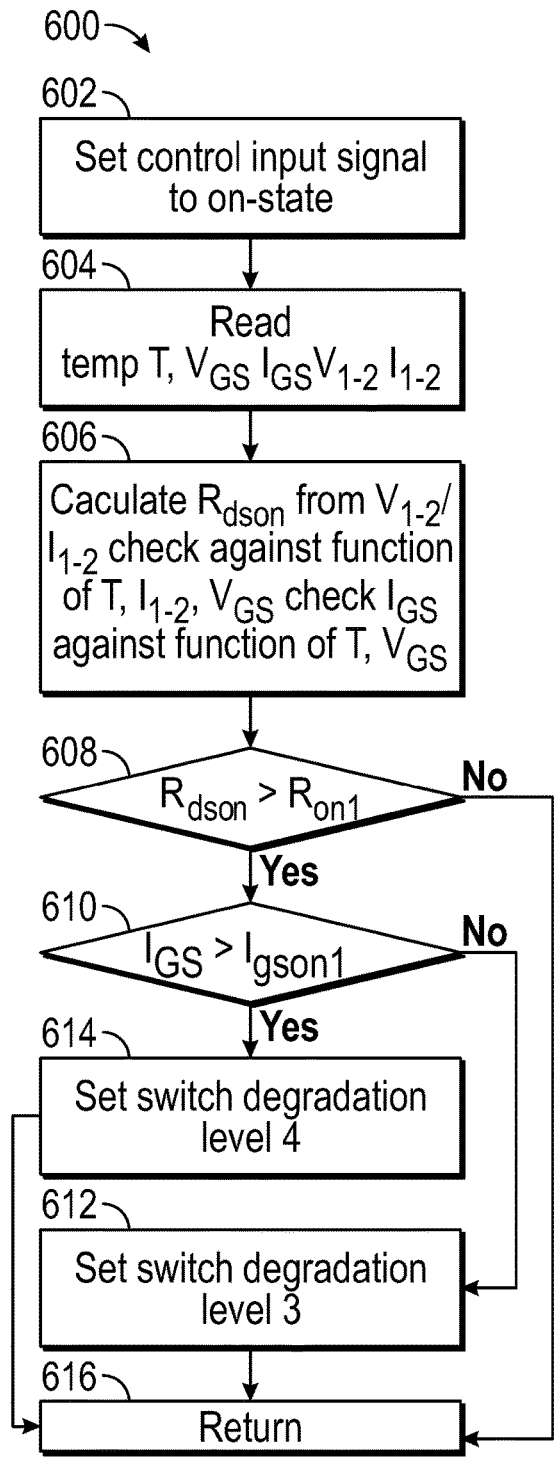
FIG. 5 is a flowchart of a fourth diagnostic method.

FIG. 5 is a flowchart of a fourth diagnostic method 600 to determine the degradation level of the electronic solid-state switch 102. The fourth diagnostic method 600 begins at block 602, in which the external controller 208 sets the control input signal CI to on-state. In other words, the external controller 208 commands the electronic solid-state switch 102 to transition to the on-state. Then, the fourth diagnostic method 600 proceeds to block 604.

At block 604, the signal processing and diagnostic controller 213 calculates drain-source resistance $R_{dson}$, which is the total resistance between the drain and source in the electronic solid-state switch 102 when the electronic solid-state switch 102 is in the on-state. To do so, the signal processing and diagnostic controller 213 divides the voltage $V_{1-2}$ between the first power terminal 132a and the second power terminal 132b by the amperage $I_{1-2}$ of the current flowing between the first power terminal 132a and the second power terminal 132b (i.e., $R_{dson}=V_{1-2}/I_{1-2}$) when the electronic solid-state switch 102 is in the on-state. Also, at block 606, the drain-source resistance $R_{dson}$ is checked against the function of temperature T, the amperage $I_{1-2}$ of the current flowing between the first power terminal 132a and the second power terminal 132b, and the gate-source voltage $V_{GS}$. This function may be in a look-up table developed through testing. The gate-source amperage $I_{GS}$ is also checked against the temperature T of the electronic solid-state switch 102 and the gate-source voltage $V_{GS}$. This function may be in a look-up table develop through testing. Then, the fourth diagnostic method 600 proceeds to block 608.

At block 608, the signal processing and diagnostic controller 213 compares the drain-source resistance $R_{dson}$ and a predetermined on-resistance threshold $R_{on1}$. If the drain-source resistance $R_{dson}$ is not greater than the predetermined on-resistance threshold $R_{on1}$, then the fourth diagnostic method 600 proceeds to block 616. At block 616, the fourth diagnostic method 600 returns to block 602. If the drain-source resistance $R_{dson}$ is greater than the predetermined on-resistance threshold $R_{on1}$, then the fourth diagnostic method 600 proceeds to block 610.

At block 610, the signal processing and diagnostic controller 213 compares the gate-source amperage $I_{GS}$ with a predetermined gate-source amperage threshold $I_{gson1}$. If the gate-source amperage $I_{GS}$ is not greater than the predetermined gate-source amperage threshold $I_{gson1}$, then the fourth diagnostic method 600 proceeds block 612. At block 612, the signal processing and diagnostic controller 213 sends the fault output signal FO, setting the degradational level of the electronic solid-state switch 102 to degradation level 3. After block 612, the fourth diagnostic method 600 proceeds to block 616. If the gate-source amperage $I_{GS}$ is greater than the predetermined gate-source amperage threshold $I_{gson1}$, then the fourth diagnostic method 600 proceeds block 614. At block 614, the signal processing and diagnostic controller 213 sends the fault output signal FO, setting the degradational level of the electronic solid-state switch 102 to degradation level 4. After block 614, the fourth diagnostic method 600 proceeds to block 616.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. A circuitry, comprising:
   an electronic solid-state switch including a first power terminal and a second power terminal;
   a driver and switch protection system electrically connected to the electronic solid-state switch, wherein the driver and switch protection system includes:
      an isolated bias power circuit configured to output a direct current voltage of at least fifteen volts;
      a current buffer circuit electrically connected between the isolated bias power circuit and the electronic solid-state switch; and
   a signal processing and diagnostic controller and an external controller each electrically connected to the electronic solid-state switch, wherein the external controller is configured to command the electronic solid-state switch to transition between an off-state and an on-state;
   wherein the external controller is configured to command the electronic solid-state switch to transition to the off-state;
   in response to transitioning to the off-state, the signal processing and diagnostic controller is configured to:
      read a gate-source voltage, a gate-source amperage, a temperature, an amperage of a current flowing between the first power terminal and the second power terminal, and a voltage between the first power terminal and the second power terminal of the electronic solid-state switch;
      compare the gate-source voltage with a predetermined-off gate-source voltage threshold;
      determine that the gate-source voltage is less than the predetermined-off gate-source voltage threshold;
      in response to determining that the gate-source voltage is less than the predetermined-off gate-source voltage threshold, compare the voltage between the first power terminal and the second power terminal with a predetermined-off voltage threshold;
      determine that the voltage between the first power terminal and the second power terminal is greater than the predetermined-off voltage threshold;
      in response to determining that the voltage between the first power terminal and the second power terminal is greater than the predetermined-off voltage threshold; compare the amperage of the current between the first power terminal and the second power terminal with a predetermined-off amperage threshold;
      determine that the amperage of the current between the first power terminal and the second power terminal is less than the predetermined-off amperage threshold;
      in response to determining that the amperage of the current between the first power terminal and the second power terminal is less than the predetermined-off amperage threshold, compare the gate-source amperage with a predetermined-off gate-source amperage threshold;
      determine that the gate-source amperage is less than the predetermined-off gate-source amperage threshold; and
      in response to determining that the gate-source amperage is less than the predetermined-off gate-source amperage threshold, set a fault output signal to pass an off-state test, indicating that electronic solid-state switch is operating normally in the off-state.

2. The circuitry of claim 1, wherein the current buffer circuit is configured to source and sink at least one ampere output current.

3. The circuitry of claim 2, wherein the current buffer circuit has an output resistance that is less than two Ohms.

4. The circuitry of claim 3, wherein the isolated bias power circuit is configured as a printed circuit board.

5. The circuitry of claim 3, wherein the isolated bias power circuit is as an on-chip integrated transformer-based power supply with one-watt +/−0.5 watt output power, and the on-chip integrated transformer-based power supply includes a plurality of transformer windings.

6. The circuitry of claim 1, wherein the external controller is configured to command the electronic solid-state switch to transition to the on-state;
   in response to transitioning to the on-state, the signal processing and diagnostic controller is configured to:
      read a gate-source voltage, a gate-source amperage, a temperature, an amperage of the current flowing between the first power terminal and the second power terminal, and a voltage between the first power terminal and the second power terminal of the electronic solid-state switch;
      compare the gate-source voltage with a predetermined-on gate-source voltage threshold;
      determine that the gate-source voltage is greater than the predetermined-on gate-source voltage threshold;
      in response to determining that the gate-source voltage is greater than the predetermined-on gate-source voltage threshold, compare the voltage between the first power terminal and the second power terminal with a predetermined-on voltage threshold;
      determine that the voltage between the first power terminal and the second power terminal is less than the predetermined-on voltage threshold;
      in response to determining that the voltage between the first power terminal and the second power terminal is less than the predetermined-on voltage threshold, compare the amperage of the current between the first power terminal and the second power terminal with a predetermined-on amperage threshold;
      determine that the amperage of the current between the first power terminal and the second power terminal is greater than the predetermined-on amperage threshold;
      in response to determining that the amperage of the current between the first power terminal and the second power terminal is greater than the predetermined-on amperage threshold, compare the gate-source amperage with a predetermined-on gate-source amperage threshold;
determine that the gate-source amperage is less than the predetermined-on gate-source amperage threshold; and
in response to determining that the gate-source amperage is less than the predetermined-on gate-source amperage threshold, set a fault output signal to pass an on-state test, indicating that electronic solid-state switch is operating normally in the on-state.

7. The circuitry of claim 1, wherein the external controller is configured to command the electronic solid-state switch to transition to the off-state;
in response to transitioning to the off-state, the signal processing and diagnostic controller is configured to:
read a gate-source voltage, a gate-source amperage, a temperature, an amperage of the current flowing between the first power terminal and the second power terminal, and a voltage between the first power terminal and the second power terminal of the electronic solid-state switch;
compare the amperage of the current flowing between the first power terminal and the second power terminal with a first predetermined-degradation-current threshold;
determine that the amperage of the current flowing between the first power terminal and the second power terminal is greater than the first predetermined-degradation-current threshold;
in response to determining that the amperage of the current flowing between the first power terminal and the second power terminal is greater than the first predetermined-degradation-current threshold, compare the amperage of the current flowing between the first power terminal and the second power terminal with a second predetermined-degradation-current threshold;
determine that the amperage of the current flowing between the first power terminal and the second power terminal is greater than the second predetermined-degradation-current threshold, wherein the second predetermined-degradation-current threshold is greater than the first predetermined-degradation-current threshold; and
in response to determining that the amperage of the current flowing between the first power terminal and the second power terminal is greater than the second predetermined-degradation-current threshold, send a fault output signal, setting a degradational level of the electronic solid-state switch to degradation level two.

8. The circuitry of claim 1, wherein the external controller is configured to command the electronic solid-state switch to transition to the on-state
in response to transition to the on-state, the signal processing and diagnostic controller is configured to:
read a gate-source voltage, a gate-source amperage, a temperature, an amperage of the current flowing between the first power terminal and the second power terminal, and a voltage between the first power terminal and the second power terminal of the electronic solid-state switch;
calculate a drain-source resistance of the electronic solid-state switch by dividing the voltage between the first power terminal and the second power terminal by the amperage of the current flowing between the first power terminal and the second power terminal;
in response to calculating the drain-source resistance of the electronic solid-state switch, compare the drain-source resistance and a predetermined on-resistance threshold;
determine that the drain-source resistance is greater than the predetermined on-resistance threshold;
in response to determining that the drain-source resistance is greater than the predetermined on-resistance threshold, compare the gate-source amperage with a predetermined gate-source amperage threshold;
determine that the gate-source amperage is greater than the predetermined gate-source amperage threshold; and
in response to determining that the gate-source amperage is greater than the predetermined gate-source amperage threshold, send a fault output signal, setting a degradational level of the electronic solid-state switch to degradation level four.

9. A circuitry, comprising:
an electronic solid-state switch including a first power terminal and a second power terminal;
an external controller electrically connected to the electronic solid-state switch, wherein the external controller is configured to command the electronic solid-state switch to transition between an off-state and an on-state;
a driver and switch protection system electrically connected to the electronic solid-state switch, wherein the driver and switch protection system includes:
a signal processing and diagnostic controller;
an isolated bias power circuit electrically connected to the signal processing and diagnostic controller; and
wherein the external controller is configured to command the electronic solid-state switch to transition to the on-state;
in response to transitioning to the on-state, the signal processing and diagnostic controller is configured to:
read a gate-source voltage, a gate-source amperage, a temperature, an amperage of a current flowing between the first power terminal and the second power terminal, and a voltage between the first power terminal and the second power terminal of the electronic solid-state switch;
compare the gate-source voltage with a predetermined-on gate-source voltage threshold;
determine that the gate-source voltage is greater than the predetermined-on gate-source voltage threshold;
in response to determining that the gate-source voltage is greater than the predetermined-on gate-source voltage threshold, compare the voltage between the first power terminal and the second power terminal with a predetermined-on voltage threshold;
determine that the voltage between the first power terminal and the second power terminal is less than the predetermined-on voltage threshold;
in response to determining that the voltage between the first power terminal and the second power terminal is less than the predetermined-on voltage threshold, compare the amperage of the current between the first power terminal and the second power terminal with a predetermined-on amperage threshold;
determine that the amperage of the current between the first power terminal and the second power terminal is greater than the predetermined-on amperage threshold;

in response to determining that the amperage of the current between the first power terminal and the second power terminal is greater than the predetermined-on amperage threshold, compare the gate-source amperage with a predetermined-on gate-source amperage threshold;

determine that the gate-source amperage is less than the predetermined-on gate-source amperage threshold; and in response to determining that the gate-source amperage is less than the predetermined-on gate-source amperage threshold, set a fault output signal to pass an on-state test, indicating that electronic solid-state switch is operating normally in the on-state.

10. The circuitry of claim 9, wherein the signal processing and diagnostic controller includes a current buffer circuit electrically connected between the isolated bias power circuit and the electronic solid-state switch, and the current buffer circuit is configured to source and sink at least one ampere output current.

11. The circuitry of claim 10, wherein the current buffer circuit has an output resistance that is less than two Ohms.

12. The circuitry of claim 11, wherein the isolated bias power circuit is configured as a printed circuit board.

13. The circuitry of claim 11, wherein the isolated bias power circuit is as an on-chip integrated transformer-based power supply with one-watt output power, and the on-chip integrated transformer-based power supply includes a plurality of transformers.

14. The circuitry of claim 9, wherein the external controller is configured to command the electronic solid-state switch to transition to the off-state;

in response to transitioning to the off-state, the signal processing and diagnostic controller is configured to:
read a gate-source voltage, a gate-source amperage, a temperature, an amperage of a current flowing between the first power terminal and the second power terminal, and a voltage between the first power terminal and the second power terminal of the electronic solid-state switch;
compare the gate-source voltage with a predetermined-off gate-source voltage threshold;
determine that the gate-source voltage is less than the predetermined-off gate-source voltage threshold;
in response to determining that the gate-source voltage is less than the predetermined-off gate-source voltage threshold, compare the voltage between the first power terminal and the second power terminal with a predetermined-off voltage threshold;
determine that the voltage between the first power terminal and the second power terminal is greater than the predetermined-off voltage threshold;
in response to determining that the voltage between the first power terminal and the second power terminal is greater than the predetermined-off voltage threshold; compare the amperage of the current between the first power terminal and the second power terminal with a predetermined-off amperage threshold;
determine that the amperage of the current between the first power terminal and the second power terminal is less than the predetermined-off amperage threshold;
in response to determining that the amperage of the current between the first power terminal and the second power terminal is less than the predetermined-off amperage threshold, compare the gate-source amperage with a predetermined-off gate-source amperage threshold;
determine that the gate-source amperage is less than the predetermined-off gate-source amperage threshold; and
in response to determining that the gate-source amperage is less than the predetermined-off gate-source amperage threshold, set a fault output signal to pass an off-state test, indicating that electronic solid-state switch is operating normally in the off-state.

15. The circuitry of claim 9, wherein the external controller is configured to command the electronic solid-state switch to transition to the on-state in response to transition to the on-state, the signal processing and diagnostic controller is configured to:
read a gate-source voltage, a gate-source amperage, a temperature, an amperage of a current flowing between the first power terminal and the second power terminal, and a voltage between the first power terminal and the second power terminal of the electronic solid-state switch;
calculate a drain-source resistance of the electronic solid-state switch by dividing the voltage between the first power terminal and the second power terminal by the amperage of the current flowing between the first power terminal and the second power terminal;
in response to calculating the drain-source resistance of the electronic solid-state switch, compare the drain-source resistance and a predetermined on-resistance threshold;
determine that the drain-source resistance is greater than the predetermined on-resistance threshold;
in response to determining that the drain-source resistance is greater than the predetermined on-resistance threshold, compare the gate-source amperage with a predetermined gate-source amperage threshold;
determine that the gate-source amperage is greater than the predetermined gate-source amperage threshold; and
in response to determining that the gate-source amperage is greater than the predetermined gate-source amperage threshold, send a fault output signal, setting a degradational level of the electronic solid-state switch to degradation level four.

16. A circuitry, comprising:
an electronic solid-state switch including a first power terminal and a second power terminal;
an external controller electrically connected to the electronic solid-state switch, wherein the external controller is configured to command the electronic solid-state switch to transition between an off-state and an on-state;
a driver and switch protection system electrically connected to the electronic solid-state switch, wherein the driver and switch protection system includes:
a signal processing and diagnostic controller;
an isolated bias power circuit electrically connected to the signal processing and diagnostic controller; and
wherein the external controller is configured to command the electronic solid-state switch to transition to the off-state;
in response to transitioning to the off-state, the signal processing and diagnostic controller is configured to:
read a gate-source voltage, a gate-source amperage, a temperature, an amperage of a current flowing between the first power terminal and the second power terminal, and a voltage between the first power terminal and the second power terminal of the electronic solid-state switch;

compare the amperage of the current flowing between the first power terminal and the second power terminal with a first predetermined-degradation-current threshold;

determine that the amperage of the current flowing between the first power terminal and the second power terminal is greater than the first predetermined-degradation-current threshold;

in response to determining that the amperage of the current flowing between the first power terminal and the second power terminal is greater than the first predetermined-degradation-current threshold, compare the amperage of the current flowing between the first power terminal and the second power terminal with a second predetermined-degradation-current threshold;

determine that the amperage of the current flowing between the first power terminal and the second power terminal is greater than the second predetermined-degradation-current threshold, wherein the second predetermined-degradation-current threshold is greater than the first predetermined-degradation-current threshold; and in response to determining that the amperage of the current flowing between the first power terminal and the second power terminal is greater than the second predetermined-degradation-current threshold, send a fault output signal, setting a degradational level of the electronic solid-state switch 102 to degradation level two.

* * * * *